United States Patent
Gao et al.

(10) Patent No.: US 8,795,449 B2
(45) Date of Patent: Aug. 5, 2014

(54) MAGNETOSTRICTIVE MATERIAL AND PREPARATION METHOD THEREOF

(75) Inventors: Xuexu Gao, Beijing (CN); Jiheng Li, Beijing (CN); Maocai Zhang, Beijing (CN); Jie Zhu, Beijing (CN); Lina Dong, Beijing (CN)

(73) Assignee: Beijing Magoriental Materials Technology Co., Ltd., Beijing (CN)

( * ) Notice: Subject to any disclaimer, the term of this patent is extended or adjusted under 35 U.S.C. 154(b) by 0 days.

(21) Appl. No.: 13/030,653

(22) Filed: Feb. 18, 2011

(65) Prior Publication Data

US 2011/0192508 A1 Aug. 11, 2011

Related U.S. Application Data

(63) Continuation of application No. PCT/CN2009/072906, filed on Jul. 24, 2009.

(30) Foreign Application Priority Data

Aug. 19, 2008 (CN) .......................... 2008 1 0135513

(51) Int. Cl.
*C21D 8/02* (2006.01)

(52) U.S. Cl.
USPC ........................... 148/546; 148/120; 148/122

(58) Field of Classification Search
USPC .................. 148/100, 120–122, 540, 546–548
See application file for complete search history.

(56) References Cited

U.S. PATENT DOCUMENTS

2008/0115864 A1* 5/2008 Flatau et al. ................... 148/621

FOREIGN PATENT DOCUMENTS

WO 2006094251 9/2006

OTHER PUBLICATIONS

"Vacuum Induction Melting." ASM Handbook, vol. 15: Casting. pp. 116-123. Dec. 2008.*
S. Guruswamy, et al., "Strong, dutile, and low-field-magnetostrictive alloys based on Fe-Ga," Scripta Mater, 2000, vol. 43, pp. 239-244.
R. A. Kellogg, A. B. Flatau, et al., "Texture and grain morphology dependencies of saturated magnetostriction in rolled polycrystalline Fe83Ga17," Journal of Applied Physics, May 15, 2003, vol. 93, No. 10, pp. 8495-8497.
N. Srisukhumbowornchai, S. Guruswamy, "Crystallographic textures in rolled and annealed Fe-Ga and Fe-Al alloys," Metallurgical and Materials Transactions A, Sep. 2004, vol. 35A, pp. 2963-2970.
Suok-Min Na, Alison B. Flatau, "Magnetostriction and surface-energy-induced selective grain growth in rolled Galfenol doped with sulfur," Proceedings of SPIE, 2005, vol. 5761, pp. 192-199.
Suok-Min Na, Alison B. Flatau, "Magnetostriction and crystallographic texture in rolled and annealed Fe-Ga based alloys," Mater. Res. Soc. Symp. Proc. vol. 888-V06-10, 2006, Materials Research Society, pp. 335-340.

* cited by examiner

*Primary Examiner* — Brian Walck
(74) *Attorney, Agent, or Firm* — Michael Best & Friedrich LLP

(57) ABSTRACT

The present invention relates to a Fe—Ga—Al-based magnetostrictive thin-sheet material and a process for preparation thereof. The raw materials used for production of the thin-sheet material is composed of the components according to the general Formula, $Fe_{100-x-y-z}Ga_xAl_yM_z$, wherein x=10-30, y=1-10, and z=0.1-5, and M is any one, or more elements selected from V, Cr, Zr, Sb, Sn, Ti, SiC.

13 Claims, 2 Drawing Sheets

MAGNETOSTRICTIVE MATERIAL AND PREPARATION METHOD THEREOF

RELATED APPLICATIONS

Priority is hereby claimed to International Patent Application No. PCT/CN2009/072906 filed on Jul. 24, 2009, and CN200810135513.8 filed on Aug. 19, 2008, the entire contents of which are hereby incorporated by reference.

TECHNICAL FIELD

The invention relates to a magnetostrictive material, particularly a Fe—Ga—Al-based magnetostrictive thin-sheet material, and also relates to a process for preparation thereof.

BACKGROUND

The phenomenon that ferromagnetic and ferrimagnetic materials undergo a small change in length and volume due to change in the magnetization state is referred to as magnetostriction, in which the change in volume is mentioned as "volume magnetostriction", and the change in length is called as "linear magnetostriction". Practical magnetostrictive materials refer to those having the linear magnetostrictive property. The degree of magnetostriction is presented by magnetostriction coefficient $\lambda$, $\lambda=\Delta L/L$ (L refers to the initial length of the material, $\Delta L$ refers to the change in length when the magnetization state is changed). The maximum magnetostriction coefficient, when the material is magnetized, is called saturated magnetostriction coefficient $\lambda_s$. Generally, $(3/2)\lambda_s$ is used as the parameter for characterizing the property of magnetostriction of a material. The value of $(3/2)\lambda_s$ can be calculated by applying the expressions $(3/2)\lambda_s=\lambda_{//}-\lambda_\perp$, in which $\lambda_{//}$ refers to the saturated magnetostriction coefficient measured along the direction parallel to the direction of the magnetic field, and $\lambda_\perp$ refers to the saturated magnetostriction coefficient measured along the direction perpendicular to the direction of the magnetic field.

As one kind of energy-transducing materials, the magnetostrictive material began to be applied to the technical field of energy transduction from 40s to 50s of the twentieth century, since the magnetostrictive materials could generate great force with a short response time when the materials undergo the magnetostriction. Later, the magnetostrictive materials were also applied to the fields of actuators, sensors and so on. Researchers focus their attentions onto improvement in the magnetostriction coefficient of the materials and onto development of novel materials with high magnetostriction coefficient, since the degree of energy-transduction of the magnetostrictive material is proportioned to the square of the magnetostriction coefficient, in the case that the magnetostrictive material is used as an energy-transducing material.

Traditional magnetostrictive material may be made of pure Ni, Ni-based alloy, Fe-based alloy and ferrite. A polycrystalline pure Ni has magnetostriction coefficient of 35 ppm to 40 ppm (1 ppm=$10^{-6}$), the magnetostriction coefficients of practical Ni-based alloy and Fe-based alloy are lower than 100 ppm, and the magnetostriction coefficients of ferrite is usually in between 10 ppm to 50 ppm.

Clark et al. of US provided a magnetostrictive material containing a rare earth metal and Fe as main components, which is referred to as rare earth giant magnetostrictive material. The rare earth giant magnetostrictive material has very high magnetostriction coefficient. A single crystal rare earth giant magnetostrictive material may have a magnetostriction coefficient of up to 2000 ppm. The magnetostriction coefficient of a polycrystalline rare earth giant magnetostrictive material may reach up to 1000 to 1500 ppm under a magnetic field of 80 kA/m and a certain pre-pressure stress. The polycrystalline rare earth giant magnetostrictive material is well applied in a field of underwater sound transducer as it has high strain and low Young modulus. However, the main phase of the polycrystalline rare earth giant magnetostrictive material is Laves phase intermetallic compound, which has intrinsic embrittlement and bad environmental tolerance, and thereby limits its applicability in various fields. In addition, this kind of material has high electrical conductivity, which seriously deteriorates the energy output or the shift output thereof due to eddy current loss when it is used under a higher frequency.

In the year of 2000, S. Guruswamy et al. (USA) reported a binary alloy which consisted of Fe and Ga (S. Guruswamy, et al. Strong, dutile, and low-field-magnetostrictive alloys based on Fe—Ga. Scripta Mater. 2000, 43: p 239-244), i.e. Fe—Ga alloy. Fe—Ga alloy is a novel magnetostrictive material having a $\lambda$ value of at least one time higher than that of traditional magnetostrictive materials and much higher intensity and magnetic permeability than that of the giant magnetostrictive materials.

The magnetostriction coefficient of Fe—Ga alloy is lower than that of the giant magnetostrictive materials, but much higher than that of the traditional magnetostrictive materials. Moreover, Fe—Ga alloy overcomes the defects of the giant magnetostrictive materials in regard to their intensity, magnetic permeability and so on. Therefore, Fe—Ga alloy has good application prospects in making transducers, actuators, sensors, and so on. However, the alloy may have eddy current loss when being used under a high frequency due to its quite low resistivity.

Accordingly, people have been trying to make the Fe—Ga alloy into thin-sheet form, so as to lower the eddy current loss in working status.

In the year of 2003, R. A. Kellogg et al. (USA) obtained a thin-sheet material having a saturated magnetostriction coefficient $(3/2)\lambda_s$ of about 170 ppm by subjecting the alloy $Fe_{83}Ga_{17}$ to treatments of hot rolling, warm rolling, and those heat-treatments for its recovery and re-crystallization (R. A. Kellogg, A. B. Flatau, et al., Texture and grain morphology dependencies of saturated magnetostriction in rolled polycrystalline $Fe_{83}Ga_{17}$; J. Applied Physics. 2003, Vol. 93, No. 10: p 8495-8497).

In 2004, N. Srisukhumbowornchai et al. (USA) reported that a Fe—Ga-based thin-sheet material with a magnetostrictive property was obtained by hot rolling, twice warm rolling at 400° C. and subsequent heat treatments of the $Fe_{85}Ga_{15}$ alloy in which 1 mol pct of NbC was added (N. Srisukhumbowornchai, S. Guruswamy, Crystallographic textures in rolled and annealed Fe—Ga and Fe—Al alloys. Metallurgical and Materials Transactions A. 2004, Vol. 35A: p 2963-2970).

In 2005, Suok-Min Na and Alison B. Flatau et al. (USA) reported that a thin-sheet material with magnetostriction property was obtained by hot rolling, warm rolling and vulcanization (surface-energy-induced texture) of the $Fe_{81.3}Ga_{18.7}$ alloy in which 0.5 at. % B was added (Suok-Min Na, Alison B. Flatau. Magnetostriction and surface-energy-induced selective grain growth in rolled Galfenol doped with sulfur. Proceedings of SPIE. 2005, Vol. 5761: p 192-199). The magnetostriction coefficient $(3/2)\lambda_s$ of the thin-sheet material obtained by this method is up to about 220 ppm (Suok-Min Na, Alison B. Flatau. Magnetostricton and crystallographic texture in rolled and annealed Fe—Ga based alloys. Mater. Res. Soc. Symp. Proc. Vol. 888, V06-10, 2006 Materials Research Society, p 335-340).

In 2006, Mungsantisuk et al. (USA) obtained a Fe—Ga-based magnetostrictive thin-sheet material by hot rolling, twice warm rolling at 400° C. and subsequent heat treatments of Fe—Ga-based alloy in which NbC or Be or Al or combinations thereof is added, wherein the alloy is sheathed to prevent oxidization and heat loss from the alloy surface during rolling (WO 2006/094251 A2).

The common deficiencies of said Fe—Ga-based magnetostrictive thin-sheet materials is that these alloy materials have bad ductibility and anti-oxidization; and their manufacturing processes are excessively complicated, including unavoidable warm rolling over more than 100 passes in total between the steps of hot rolling and cold rolling, repeatedly stress-relief annealing during rolling, and sometimes sheathing the master alloy.

SUMMARY OF INVENTION

One object of the present invention is to provide a magnetostrictive material that has a high magnetostriction coefficient, excellent mechanical properties and can be used under higher frequency. Another object is to provide a process for preparation of the same.

The objects of the present invention are realized by the technical solutions as described below.

In one aspect, the present invention provides a Fe—Ga—Al-based magnetostrictive thin-sheet material, for which the components of raw materials are represented by the following general Formula:

$$Fe_{100-x-y-z}Ga_xAl_yM_z,$$

wherein, x=10-30, preferably, 15-25; y=1-10, preferably, 1-1.5; z=0.1-5, preferably, 1-3;

M is any one, two or more elements selected from V, Cr, Zr, Sb, Sn, Ti and SiC; wherein the figure 100, x, y and z in the Formula are respectively atomic percentages of the corresponding metal elements.

The Fe—Ga—Al-based magnetostrictive thin-sheet material has a thickness of 0.03 mm to 0.95 mm.

The present invention further provides a process for preparation of the Fe—Ga—Al-based magnetostrictive thin-sheet material, which comprises the steps:

(1) proportioning raw materials according to the given ratios of the components of the raw materials, and additionally adding 1 atomic percent (hereinafter "at. %") to 5 at. % Ga as Loss on ignition (LOI);

(2) smelting the materials obtained in step (1) in a protective atmosphere and casting the smelted product to form an alloy ingot, wherein the protective atmosphere may be any inert gas, preferably argon gas;

(3) forging the alloy ingot at a temperature of 850° C. to 1100° C., preferably 900° C. to 1000° C., to a forging deformation of 10% to 90%, preferably 60% to 80%;

(4) hot rolling the forged alloy at a temperature of 900° C. to 1100° C., preferably 950° C. to 1000° C., to a hot rolling deformation of 50% to 90%, preferably 60% to 80%;

(5) cold rolling the hot rolled alloy at room temperature over 10 to 30 passes, preferably 15 to 20 passes, to a cold rolling deformation of 60% to 90%, preferably 70% to 85%; and (6) preserving the cold rolled alloy at a temperature of 1000° C. to 1300° C., preferably 1100° C. to 1200° C., for 1 to 24 hours, preferably 4 to 6 hours, and then cooling it by a conventional means, preferably by water quenching.

In step (1) of the invention, the addition of the additional Ga as LOI is aimed at ensuring the predetermined ratios of the components after the raw materials are subjected to high temperature treatments. The smelting of step (2) is for obtaining an alloy having good homogeneity. The protective atmosphere filled up during smelting is aimed at ensuring that the alloy not to be oxidized and at preventing the alloy elements from volatilization. The forging of step (3) is aimed at reducing the processing work in the rolling and at adjusting the size of the alloy so as to meet the rolling requirements. The rollings of steps (4) and (5) are aimed at obtaining the thin-sheet material. The heat preservation treatment of step (6) is for achieving good magnetostrictive properties.

The Fe—Ga—Al-based alloy together with the addition of other elements according to the present invention has excellent plasticity and improved ductility compared to the Fe—Ga binary alloy and those Fe—Ga-based alloys containing minor other alloy elements as reported in the related prior art publications, thus it can be readily pressed to form a quite thin sheet material by subsequent treatments, which directly results in inhibiting eddy current loss to a substantial extent, and improving anti-oxidization. For example, the specific benefits are as follows:

(1) the alloy has excellent ductility at room temperature so that it won't crack during cold rolling;

(2) it can be cold rolled in preparation processes due to the excellent plasticity, so that no warm rolling step at about 400° C. is required and the total passes are greatly reduced;

(3) no repeated annealing steps are required in the rolling processes due to the excellent plasticity;

(4) no sheathing step is necessary in the rolling processes any more due to the excellent anti-oxidization;

(5) the alloy obtains crystallography orientation during rolling; and (6) the alloy achieves good magnetostrictive properties after the heat preservation treatments.

Due to the above benefits, the process according to the present invention represents important improvements to the prior art in terms of its advantages such as high efficiency, energy-saving, simple and easy to operate, and low cost. In addition, the end product has a good texture homogeneity that facilitates wide applications of the product according to the invention.

The alloy thin-sheet plate obtained by the inventive process has a regular shape and excellent toughness.

The rolled thin-sheet material according to the invention has high magnetostrictive property along the rolling direction. The magnetostriction coefficient $(3/2)\lambda_s$ can reach to 200 ppm or above.

The magnetostrictive thin-sheet material obtained by the inventive process is suitable for making those devices which require a magnetostrictive material in the thin-sheet plate shape. In addition, since the thin-sheet shape could effectively suppresses eddy current loss, the inventive product is also suitable to be used in a middle or high frequency transducer and super sound transducer so as to improve the efficiencies thereof. Also, the magnetostrictive material according to the invention has good applicability in the fields of actuators, sensors, and the like.

EMBODIMENTS OF INVENTION

With conjunction of the attached drawings, detailed illustrations of the invention are set forth hereinafter; however they should not be understood as any limitation to the invention.

Example 1

Preparation of a Magnetostrictive Thin-Sheet Material $Fe_{80}Ga_{16.5}Al_{1.5}Cr_2$ by Rolling Process Raw materials according to formula $Fe_{80}Ga_{16.5}Al_{1.5}Cr_2$ were weighted out, of which the purity of the iron was greater than 99.5%, and additional 3% Ga was added as LOI. The mixture of the raw materials was put into a crucible of a vacuum induction furnace, which was vacuumed to $5\times10^{-3}$ Pa and then filled with argon gas until the pressure reached 0.5 MPa, and the raw materials began to smelt. After the raw materials were entirely melted, the result was refined for 3 minutes and then casted to an alloy ingot in the furnace so as to obtain an as-cast alloy ingot.

The as-cast alloy ingot was forged at 900° C. to form a rectangle forged blank with 6.5 mm thickness and 70% deformation.

The forged blank was hot rolled at 950° C. to give 80% deformation, during which the deformation rate and the interval time between passes were controlled, to give a thickness of 1.3 mm so as to obtain a hot rolled blank.

The hot rolled blank was cold rolled at room temperature over 20 passes to give a 80% deformation and to give a thickness of 0.26 mm, so as to obtain a rolled alloy.

The rolled alloy was kept at 1200° C. for 4 hours, then cooled down by water to room temperature, so as to obtain the thin-sheet material.

The thin-sheet material has a maximum magnetostriction coefficient $(3/2)\lambda_s$ of 241 ppm along the rolling direction.

Figure 2A:
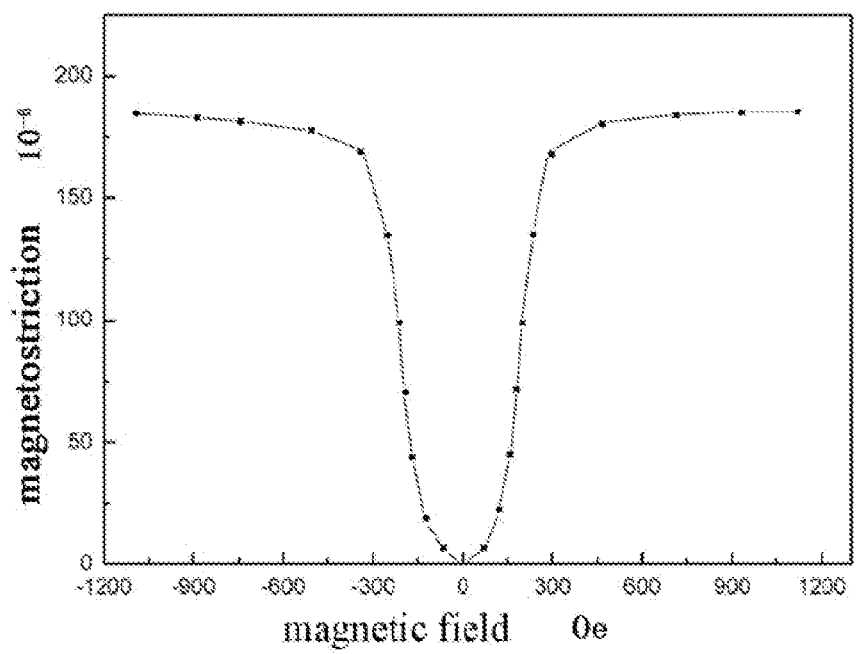
FIGS. 2a and 2b respectively show the function curves of $\lambda_{//}$-H along (parallel to) the rolling direction and of $\lambda_{\perp}$-H perpendicular to the rolling direction of the magnetostrictive thin-sheet material prepared according to the examples of the invention.
Figure 2B:
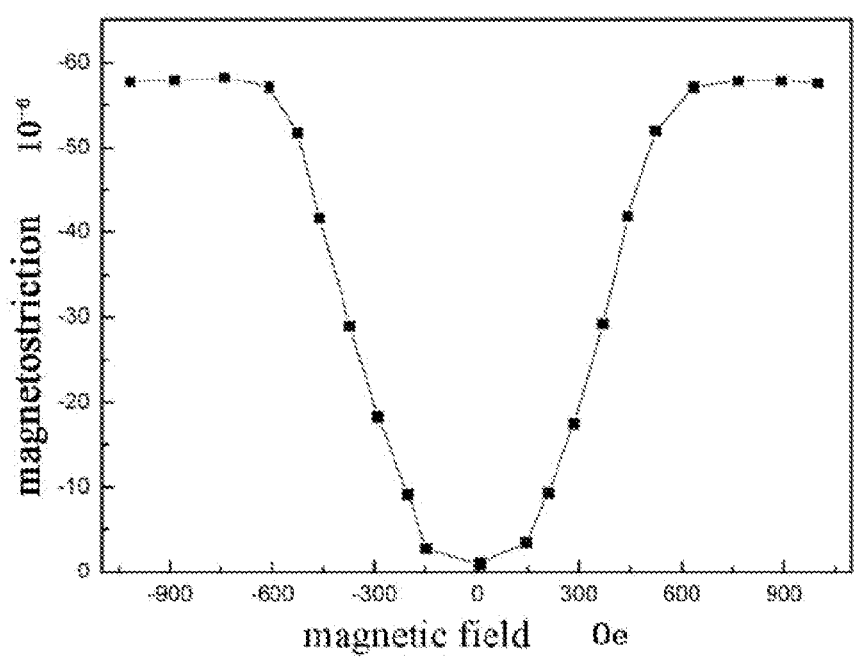

FIGS. 2a and 2b respectively show the function curves of $\lambda_{//}$ and $\lambda_{\perp}$ of the magnetostrictive thin-sheet material $Fe_{80}Ga_{16.5}Al_{1.5}Cr_2$, from which it could be known that, when the magnetic field parallels is applied along the rolling direction, the magnetostriction coefficient is about 184 ppm at an applied magnetic field of 3000 e; and when the magnetic field is applied perpendicular to the rolling direction, the saturated magnetic field is about 6000 e and the saturated magnetostriction is about −57 ppm.

Example 2

Preparation of a Magnetostrictive Thin-Sheet Material $Fe_{81}Ga_{16.5}Al_{1.1}Zr_{0.9}Sn_{0.5}$ by Rolling Process Raw materials according to formula $Fe_{81}Ga_{16.5}Al_{1.1}Zr_{0.9}Sn_{0.5}$ were weighted out, in which the purity of the iron was greater than 99.5%, and additional 2% Ga was added as LOI. The mixture of the raw materials was put into a crucible of a vacuum induction furnace, which was vacuumed to $5\times10^{-3}$ Pa and then filled with argon gas until the pressure reached 0.5 MPa, and then was smelted and cast to an alloy ingot so as to obtain an as-cast alloy ingot.

The as-cast alloy ingot was forged at 950° C. to form a rectangle forged blank with a thickness of 6.2 mm and 65% deformation.

The forged blank was hot rolled at 950° C. to give 75% deformation, during which the deformation rate and the interval time between passes were controlled, and to give a thickness of 1.6 mm so as to obtain a hot rolled blank.

The hot rolled blank was cold rolled at room temperature over 15 passes to give a 70% deformation and to give a thickness of 0.48 mm so as to obtain a rolled alloy.

The rolled alloy was kept at 1200° C. for 4 hours, then cooled down by water to room temperature so as to obtain the thin-sheet material.

The thin-sheet material has a maximum magnetostriction coefficient $(3/2)\lambda_s$ of 223 ppm.

Figure 1:
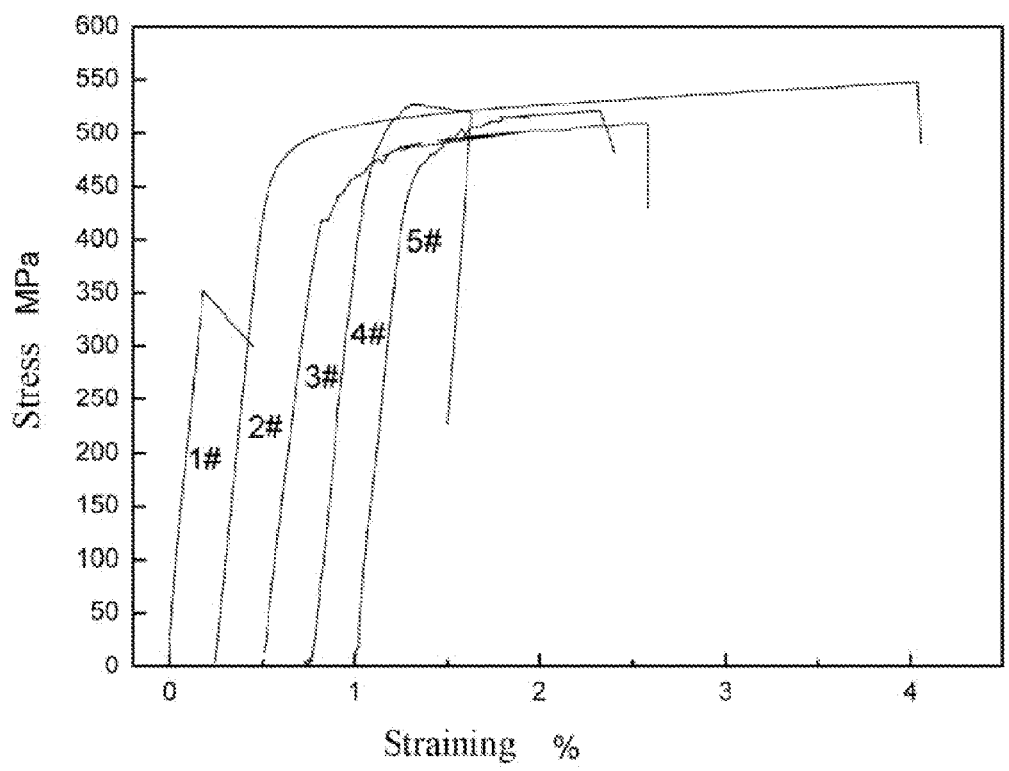
FIG. 1 shows the stretching mechanical property at room temperature of the two as-cast alloys according to the invention in comparison with that of the as-cast alloys of the prior art, in which 1# represents the as-cast alloy $Fe_{83}Ga_{17}$ known from the prior art, 2# and 3# respectively represent the two as-cast alloy of the invention $Fe_{80}Ga_{16.5}Al_{1.5}Cr_2$  and $Fe_{81}Ga_{16.5}Al_{1.1}Zr_{0.9}Sn_{0.5}$, and 4# and 5# respectively represent two prior art as-cast alloy $Fe_{84.15}Ga_{14.85}NbC$ and $Fe_{80.9}Ga_{18.6}B_{0.5}$.

FIG. 1 shows the stretching mechanical property at room temperature of the two as-cast alloys according to Example 1 and Example 2 of the invention, 2# $Fe_{80}Ga_{16.5}Al_{1.5}Cr_2$ and 3# $Fe_{81}Ga_{16.5}Al_{1.1}Zr_{0.9}Sn_{0.5}$ respectively, in comparison with that of the three prior art as-cast alloys 1# $Fe_{83}Ga_{17}$, 5# $Fe_{84.15}Ga_{14.85}NbC$ and $Fe_{80.9}Ga_{18.6}B_{0.5}$, and it is known from the curves the plasticity properties of the two inventive alloy are greatly improved, which facilitates the subsequent rolling process.

Example 3

Preparation of a Thin-Sheet Magnetostrictive Alloy of $Fe_{79.8}Ga_{17}Al_{1.2}V_{1.5}Sb_{0.5}$ by Rolling Process Raw materials according to the formula $Fe_{79.8}Ga_{17}Al_{1.2}V_{1.5}Sb_{0.5}$ were weighted out, in which the purity of the iron was greater than 99.5%, and additional 4% Ga was added as LOI. The mixture of the raw materials was put into a crucible of a vacuum induction furnace, which was vacuumed to $5\times10^{-3}$ Pa and then filled with argon gas until the pressure reached 0.5 MPa, and then was smelted and casted to an alloy ingot so as to obtain an as-cast alloy ingot.

The as-cast alloy ingot was forged at 1000° C. to form a rectangle forged blank with a thickness of 5.6 mm and 70% deformation.

The forged blank was hot rolled at 1000° C. to give 70% deformation, during which the deformation rate and the interval time between passes were controlled, and to give a thickness of 1.7 mm so as to obtain a hot rolled blank.

The hot rolled blank was cold rolled at room temperature over 18 passes to give 80% deformation and a thickness of 0.34 mm so as to obtain a rolled alloy.

The rolled alloy was kept at 1150° C. for 6 hours, then cooled down by water to room temperature so as to obtain the thin-sheet material.

The thin-sheet material has a magnetostriction coefficient $(3/2)\lambda_s$ of up to 215 ppm.

The invention claimed is:
1. A method of preparing a magnetostrictive sheet material, said method consisting of:
(1) proportioning raw materials of the magnetostrictive sheet material according to ratios of the components which conform to the following general Formula: $Fe_{100-x-y-z}Ga_xAl_yM_z$, and additionally adding 1 at. % to 5 at. % Ga as LOI, wherein M is at least one of V, Cr, Zr, Sb, and Sn, x is no less than 15 and no greater than 25, y is no less than 1 and no greater than 1.5, and z is no less than 1 and no greater than 3;

(2) smelting the raw materials obtained in step (1) in a protective atmosphere and casting the raw materials to form an alloy ingot;

(3) forging the alloy ingot at a temperature no less than 850° C. and no greater than 1100° C. with a forging deformation no less than 10% and no greater than 90%;

(4) hot rolling the alloy ingot at a temperature no less than 900° C. and no greater than 1100° C., with a hot rolling deformation no less than 50% and no greater than 90%;

(5) cold rolling the alloy ingot at room temperature over 10 to 30 passes with a cold rolling deformation no less than 60% and no greater than 90%; and (6) preserving the alloy ingot at a temperature no less than 1000° C. and no greater than 1300° C. for 1 to 24 hours, and then cooling the alloy ingot to room temperature.

2. A method of preparing a magnetostrictive sheet material, said method consisting of:

(1) proportioning raw materials of the magnetostrictive sheet material according to ratios of the components which conform to the following general Formula: $Fe_{100-x-y-z}Ga_xAl_yM_z$, and additionally adding 1 at. % to 5 at. % Ga as LOI, wherein M is at least one of V, Cr, Zr, Sb, and Sn, x is no less than 17 and no greater than 19, y is no less than 1.2 and no greater than 1.4, and z is no less than 1.5 and no greater than 2.5;

(2) smelting the raw materials obtained in step (1) in a protective atmosphere and casting the raw materials to form an alloy ingot;

(3) forging the alloy ingot at a temperature no less than 850° C. and no greater than 1100° C. with a forging deformation no less than 10% and no greater than 90%;

(4) hot rolling the alloy ingot at a temperature no less than 900° C. and no greater than 1100° C., with a hot rolling deformation no less than 50% and no greater than 90%;

(5) cold rolling the alloy ingot at room temperature over 10 to 30 passes with a cold rolling deformation no less than 60% and no greater than 90%; and (6) preserving the alloy ingot at a temperature no less than 1000° C. and no greater than 1300° C. for 1 to 24 hours, and then cooling the alloy ingot to room temperature;

wherein the resulting sheet material has a thickness of 0.03 mm to 0.95 mm.

3. The method of claim 1, wherein, in step (3), the alloy ingot is forged at a temperature no less than 900° C. and no greater than 1000° C. and the forging deformation is no less than 60% and no greater than 80%.

4. The method of claim 2, wherein, in step (3), the alloy ingot is forged at a temperature no less than 900° C. and no greater than 1000° C. and the forging deformation is no less than 60% and no greater than 80%.

5. The method of claim 1, wherein, in step (4), the alloy ingot is hot rolled at a temperature no less than 950° C. and no greater than 1000° C. and the hot rolling deformation is no less than 60% and no greater than 80%.

6. The method of claim 2, wherein, in step (4), the alloy ingot is hot rolled at a temperature no less than 950° C. and no greater than 1000° C. and the hot rolling deformation is no less than 60% and no greater than 80%.

7. The method of claim 1, wherein, in step (5), the deformation is no less than 70% and no greater than 85% and the alloy ingot is cold rolled over 15 to 20 passes.

8. The method of claim 2, wherein, in step (5), the deformation is no less than 70% and no greater than 85% and the alloy ingot is cold rolled over 15 to 20 passes.

9. The method of claim 1, wherein, in step (6), the alloy ingot is preserved at a temperature no less than 1100° C. and no greater than 1200° C. for 4 to 6 hours and the alloy ingot is cooled by water quenching.

10. The method of claim 2, wherein, in step (6), the alloy ingot is preserved at a temperature no less than 1100° C. and no greater than 1200° C. for 4 to 6 hours and the alloy ingot is cooled by water quenching.

11. The method of claim 1, wherein the resulting sheet material has a thickness of 0.03 mm to 0.95 mm.

12. The method of claim 1, wherein, in step (2), the protective atmosphere consists essentially of argon gas.

13. The method of claim 2, wherein, in step (2), the protective atmosphere consists essentially of argon gas.

* * * * *